(12) United States Patent
Jung

(10) Patent No.: US 10,734,041 B2
(45) Date of Patent: Aug. 4, 2020

(54) SEMICONDUCTOR APPARATUS RELATED TO TERMINATION AND SEMICONDUCTOR SYSTEM INCLUDING THE SEMICONDUCTOR APPARATUS

(71) Applicant: SK hynix Inc., Icheon-si, Gyeonggi-do (KR)

(72) Inventor: Hae Kang Jung, Gwangmyeong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/549,254

(22) Filed: Aug. 23, 2019

(65) Prior Publication Data

US 2020/0202908 A1     Jun. 25, 2020

(30) Foreign Application Priority Data

Dec. 24, 2018     (KR) ........................ 10-2018-0168429

(51) Int. Cl.
| | |
|---|---|
| *H03K 19/00* | (2006.01) |
| *G11C 7/10* | (2006.01) |
| *G06F 13/10* | (2006.01) |
| *G06F 13/16* | (2006.01) |
| *G06F 3/06* | (2006.01) |
| *G06F 13/36* | (2006.01) |
| *G11C 7/12* | (2006.01) |

(52) U.S. Cl.
CPC .......... *G11C 7/1048* (2013.01); *G06F 3/0617* (2013.01); *G06F 13/1668* (2013.01); *G06F 13/1689* (2013.01); *G06F 13/36* (2013.01); *G11C 7/1057* (2013.01); *G11C 7/12* (2013.01); *H03K 19/0005* (2013.01)

(58) Field of Classification Search
CPC ......... G11C 8/12; G11C 11/4093; G11C 7/10; G11C 8/18; G11C 29/1201; G11C 29/50008; H01L 25/0657; G06F 13/4234; G06F 13/4086; G06F 3/061; H03K 19/0005; H03K 19/017545; H03K 19/018585; H04L 25/0278; H05K 1/025
See application file for complete search history.

(56) References Cited

U.S. PATENT DOCUMENTS

| | | | | |
|---|---|---|---|---|
| 7,554,353 | B2 * | 6/2009 | Lee | ..................... H04L 25/0278 326/30 |
| 8,988,102 | B2 * | 3/2015 | Shaeffer | ................. G11C 5/063 326/30 |
| 9,082,758 | B2 * | 7/2015 | Lee | ........................ H01L 23/481 |
| 9,337,835 | B2 | 5/2016 | Oh et al. | |
| 9,705,498 | B2 * | 7/2017 | Shaeffer | ............... G11C 7/1084 |
| 9,940,984 | B1 * | 4/2018 | Hossain | ............... G11C 7/1072 |
| 10,014,860 | B2 * | 7/2018 | Shaeffer | ................. G11C 16/06 |
| 10,056,902 | B2 * | 8/2018 | Oh | ........................ G06F 3/0659 |

(Continued)

FOREIGN PATENT DOCUMENTS

KR     101606452 B1     3/2016

*Primary Examiner* — Vibol Tan
(74) *Attorney, Agent, or Firm* — William Park & Associates Ltd.

(57) ABSTRACT

A semiconductor apparatus includes a first chip and a second chip. The first chip provides a first termination control signal to the second chip and the second chip provides a termination resistance for the first chip based on the first termination control signal, when the first chip receives data.

18 Claims, 4 Drawing Sheets

(56) References Cited

U.S. PATENT DOCUMENTS

| | | | |
|---|---|---|---|
| 10,270,442 B2* | 4/2019 | Oh | G11C 11/401 |
| 10,284,198 B2* | 5/2019 | Lee | G11C 7/1057 |
| 10,318,182 B2* | 6/2019 | Park | G06F 3/0659 |
| 10,333,519 B2* | 6/2019 | Shaeffer | H03K 19/017545 |
| 10,490,239 B2* | 11/2019 | Tomishima | G11C 7/1015 |
| 2019/0139585 A1* | 5/2019 | Kim | G11C 7/1057 |

* cited by examiner

SEMICONDUCTOR APPARATUS RELATED TO TERMINATION AND SEMICONDUCTOR SYSTEM INCLUDING THE SEMICONDUCTOR APPARATUS

CROSS-REFERENCES TO RELATED APPLICATION

The present application claims priority under 35 U.S.C. § 119(a) to Korean application number 10-2018-0168429, filed on Dec. 24, 2018, in the Korean Intellectual Property Office, which is incorporated herein by reference in its entirety as set forth in full.

BACKGROUND

1. Technical Field

Various embodiments generally relate to an integrated circuit technology and, more particularly, to a semiconductor apparatus and a semiconductor system related to termination.

2. Related Art

An electronic device includes a lot of electronic elements, and a computer system includes lots of electronic components each comprising a semiconductor. Semiconductor apparatuses configuring a computer system may transmit data in synchronization with a clock and may perform a serial communication communicate with each other. As an operation speed of a semiconductor apparatus increases and power consumption of the semiconductor apparatus decreases, transmitted signals may be distorted due to influence of an external noise, reflection of a signal transmission line and impedance mismatch between semiconductor apparatuses communicating with each other. Therefore, a semiconductor apparatus is generally provided with an on-die termination circuit configured to match impedance between transmission and reception ends for the precise transmission of a signal.

SUMMARY

In an embodiment, a semiconductor apparatus may include a first chip and a second chip. The first chip may be configured to generate a first termination control signal based on a command signal. The second chip may be coupled to the first chip. The first chip may transmit the first termination control signal to the second chip and the second chip may provide a termination resistance based on the first termination control signal.

In an embodiment, a semiconductor apparatus may include a first chip coupled to a second chip. The first chip may include a data circuit, a command circuit, and a first termination control circuit. The data circuit may be coupled to a data bus, and configured to receive data transmitted through the data bus. The command circuit may be coupled to a command bus and a first chip selection bus and configured to receive a command signal through the command bus and receive a first chip selection signal through the first chip selection bus. The first termination control circuit may be configured to generate a first termination control signal based on the command signal. The second chip may include a data circuit, a command circuit, and a second termination control circuit. The data circuit may be coupled to the data bus, and configured to receive data transmitted through the data bus and receive the first termination control signal from the first chip. The command circuit may be coupled to the command bus and a second chip selection bus and configured to receive the command signal through the command bus and receive a second chip selection signal through the second chip selection bus. The second termination control circuit may be configured to generate a second termination control signal based on the command signal.

In an embodiment, a semiconductor system may include a data bus, a command bus, a first chip selection bus, a second chip selection bus, a second chip selection bus, a first semiconductor apparatus, and a second semiconductor apparatus. The first semiconductor apparatus may be configured to transmit data through the data bus, transmit a command signal through the command bus, transmit a first chip selection signal through the first chip selection bus and transmit a second chip selection signal through the second chip selection bus. The second semiconductor apparatus may include a first chip and a second chip. The first chip may be coupled to the data bus, the command bus and the first chip selection bus and configured to receive the data, the command signal and the first chip selection signal. The second chip may be coupled to the data bus, the command bus and the second chip selection bus and configured to receive the data, the command signal and the second chip selection signal. The second chip may set a reception end of the data bus to have a termination resistance value when the first chip selection signal is enabled and the first chip receives the data. The first chip may set the reception end of the data bus to have the termination resistance value when the second chip selection signal is enabled and the second chip receives the data.

DETAILED DESCRIPTION

Hereinafter, a semiconductor apparatus according to the present disclosure will be described below with reference to the accompanying drawings through various embodiments.

Figure 1:
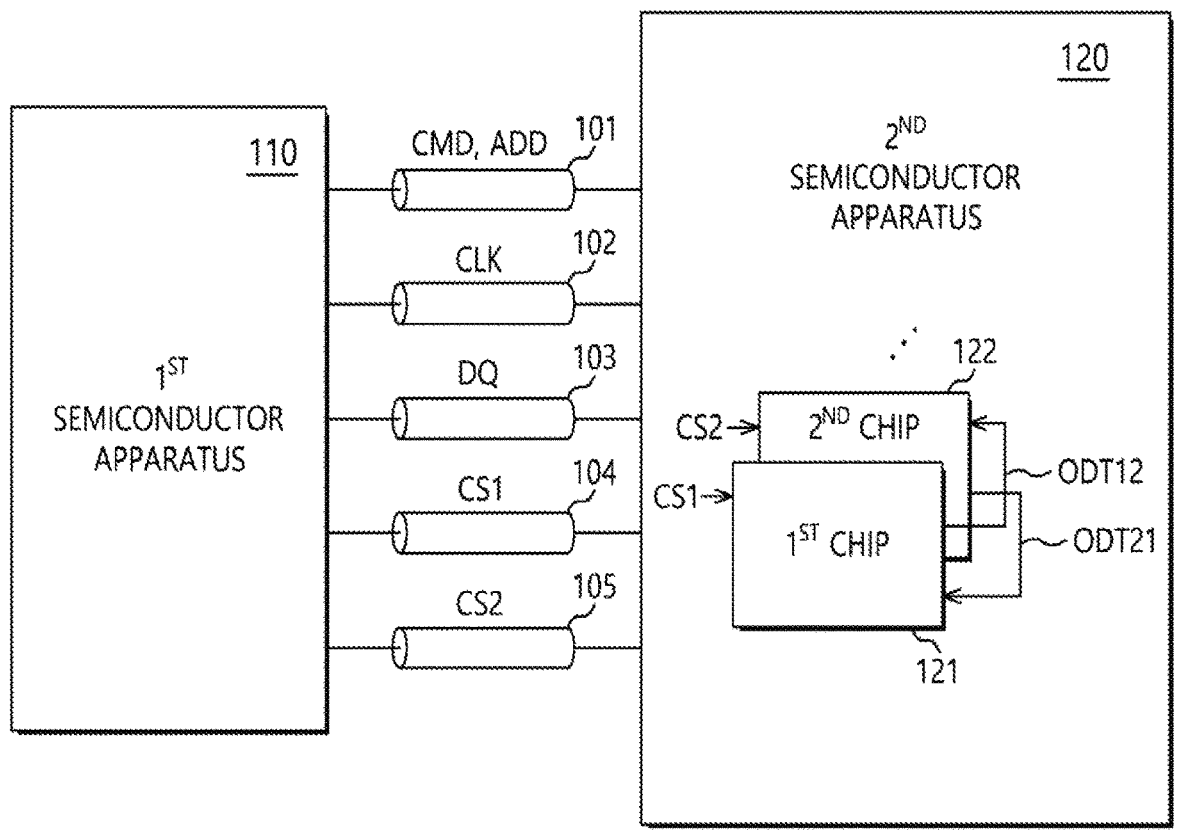
FIG. 1 is a diagram illustrating a configuration of a semiconductor apparatus and a semiconductor system in accordance with an embodiment.

FIG. 1 is a diagram illustrating a configuration of a semiconductor system 100 in accordance with an embodiment. Referring to FIG. 1, the semiconductor system 100 may include a first semiconductor apparatus 110 and a second semiconductor apparatus 120. The first semiconductor apparatus 110 may provide various control signals for the second semiconductor apparatus 120 to operate. The first semiconductor apparatus 110 may be a master device for controlling the second semiconductor apparatus 120. The first semiconductor apparatus 110 may include apparatuses of various types. For example, the first semiconductor apparatus 110 may be a host device such as a central processing unit (CPU), a graphic processing unit (GPU), a multi-media processor (MMP), a digital signal processor, an application processor (AP) and a memory controller.

The second semiconductor apparatus 120 may perform various operations under the control of the first semiconductor apparatus 110. The second semiconductor apparatus 120 may be a slave device controlled by the first semiconductor apparatus 110. The second semiconductor apparatus 120 may include various memory modules such as a Unbuffered Dual In-line Memory Module (UDIMM), a Dual In-line Memory Module (DIMM), a Registered Dual In-line Memory Module (RDIMM), a Load Reduced Dual In-line Module (LRDIMM), a Small Outline Dual In-line Module (SODIMM), a Non-Volatile Dual In-line Memory Module (NVDIMM) and so forth. The second semiconductor apparatus 120 may include 3-dimensionally stacked memory device such as a Hybrid Memory Cube (HMC), a High Bandwidth Memory (HBM) and so forth.

The second semiconductor apparatus 120 may include a plurality of chips having a first chip 121 and a second chip 122. The plurality of chips may perform the same operation. A part or whole of the plurality of chips may perform different operations from each other. The first chip 121 and the second chip 122 may be memories that may include a volatile memory and a non-volatile memory. The volatile memory may include a static random access memory (static RAM: SRAM) and a dynamic RAM (DRAM), a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 120 may be coupled to the first semiconductor apparatus 110 through a plurality of buses. The plurality of buses may be a signal transmission path, a link or a channel for transferring a signal. The plurality of buses may include a command address bus 101, a clock bus 102, a data bus 103, chip selection buses 104 and 105, and so forth. Each of the command address bus 101, the clock bus 102 and the chip selection buses 104 and 105 may be a unidirectional bus and the data bus 103 may be a bidirectional bus. The second semiconductor apparatus 120 may be coupled to the first semiconductor apparatus 110 through the command address bus 101 and may receive a command signal CMD and/or an address signal ADD through the command address bus 101. The second semiconductor apparatus 120 may be coupled to the first semiconductor apparatus 110 through the clock bus 102 and may receive a system clock signal CLK through the clock bus 102. The system clock signal CLK may include one or more pairs of clock signals. The second semiconductor apparatus 120 may be coupled to the first semiconductor apparatus 110 through the data bus 103 and may receive data DQ from the first semiconductor apparatus 110 or transmit data DQ to the first semiconductor apparatus 110 through the data bus 103. The second semiconductor apparatus 120 may be coupled to the first semiconductor apparatus 110 through the chip selection buses 104 and 105 and may receive a chip selection signal through the chip selection buses 104 and 105.

The semiconductor system 100 may include a plurality of chip selection buses. A plurality of chip selection signals may be transferred through the plurality of chip selection buses. A number of the chip selection buses or a number of the chip selection signals may correspond to a number of chips included in the second semiconductor apparatus 120. When the second semiconductor apparatus 120 includes the first chip 121 and the second chip 122, the first semiconductor apparatus 110 and the second semiconductor apparatus 120 may be coupled to each other through the first chip selection bus 104 and the second chip selection bus 105. The first chip 121 may receive a first chip selection signal CS1 through the first chip selection bus 104 and the second chip 122 may receive a second chip selection signal CS2 through the second chip selection bus 105. The second semiconductor apparatus 120 may receive the command signal CMD and/or the address signal ADD and the first chip selection signal CS1 and the second chip selection signal CS2 in synchronization with the system clock signal CLK. The second semiconductor apparatus 120 may receive the data DQ from the first semiconductor apparatus 110 in synchronization with the system clock signal CLK and may transmit the data DQ to the first semiconductor apparatus 110 in synchronization with the system clock signal CLK.

The first chip 121 and the second chip 122 may be commonly coupled to the command address bus 101, the clock bus 102 and the data bus 103. The first chip 121 may receive the command signal CMD and/or the address signal ADD through the command address bus 101 and may receive the data DQ through the data bus 103 when the first chip selection signal CS1 is enabled. The second chip 122 may receive the command signal CMD and/or the address signal ADD through the command address bus 101 and may receive the data DQ through the data bus 103 when the second chip selection signal CS2 is enabled. Each of the first chip 121 and the second chip 122 may perform a termination operation to reduce a noise and reflection that may occur on the data bus 103 when receiving the data DQ through the data bus 103. For example, each of the first chip 121 and the second chip 122 may set a reception end of the data bus 103 to have a termination resistance value such that the reception end of the data bus 103 has the same impedance as a transmission end of the data bus 103.

When the first chip selection signal CS1 is enabled, the first chip 121 generally receives the data DQ and thus the first chip 121 may set the reception end of the data bus 103 to have the termination resistance value. When the second chip selection signal CS2 is enabled, the second chip 122 generally receives the data DQ and thus the second chip 122 may set the reception end of the data bus 103 to have the termination resistance value. However, the quality or integrity of the data DQ that the first chip 121 receives may be more improved when the first chip 121 receives the data DQ and the second chip 122 instead of the first chip 121 sets the reception end of the data bus 103 to have the termination resistance value. Such termination operation may be referred to as Non-Target On-Die Termination. In accordance with an embodiment, the first chip 121 may provide the termination resistance for the second chip 122 and the second chip 122 may provide the termination resistance for the first chip 121 in order to embody the Non-Target On-Die Termination.

The first chip 121 may generate a first termination control signal ODT12 based on the command signal CMD when the first chip selection signal CS1 is enabled. The second chip 122 may generate a second termination control signal ODT21 based on the command signal CMD when the second chip selection signal CS2 is enabled. Each of the first termination control signal ODT12 and the second termination control signal ODT21 may be enabled to set the reception end of the data bus 103 to have the termination resistance value. The first chip 121 may provide the second chip 122 with the first termination control signal ODT12 and the second chip 122 may set the reception end of the data bus 103 to have the termination resistance value used by the first chip 121 to receive data DQ based on the first termination control signal ODT12. The second chip 122 may provide the first chip 121 with the second termination control signal ODT21 and the first chip 121 may set the reception end of the data bus 103 to have the termination resistance value used by the second chip 122 to receive precise data DQ based on the second termination control signal ODT21.

Figure 2A:
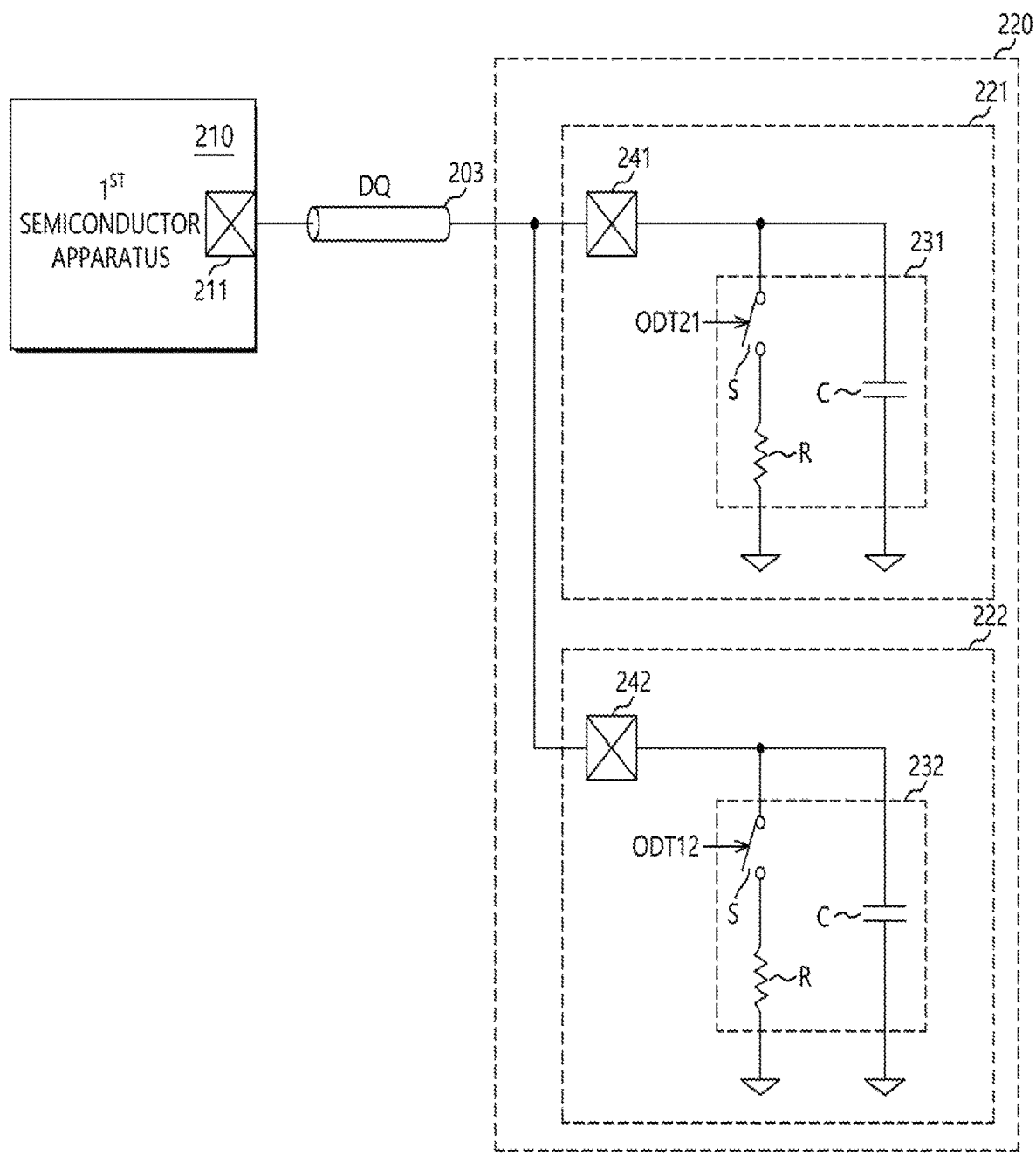
FIGS. 2A and 2B are diagrams each illustrating a configuration of a semiconductor apparatus in accordance with an embodiment.
Figure 2B:
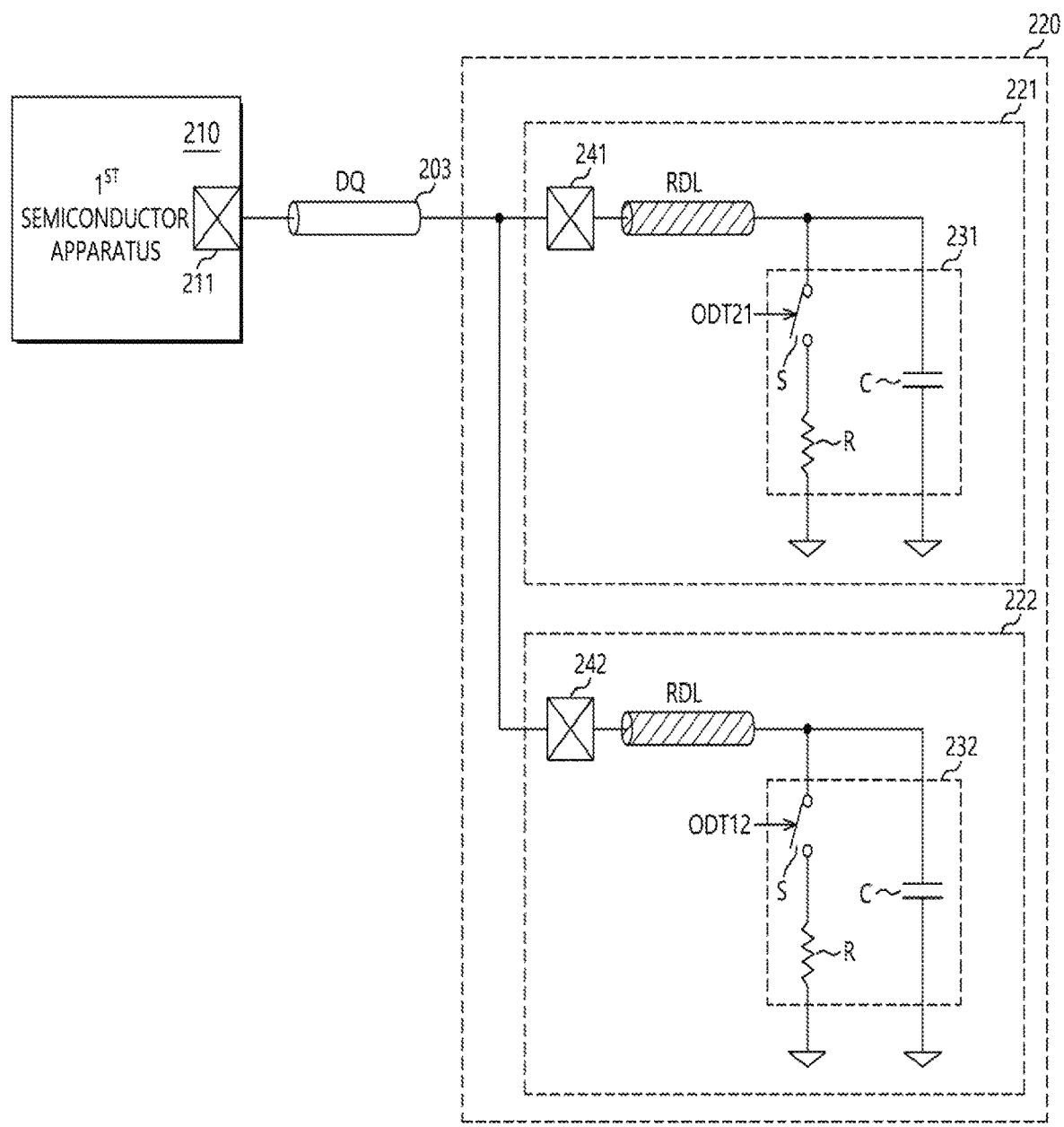

FIGS. 2A and 2B are diagrams schematically illustrating configurations of semiconductor systems 200A and 200B in accordance with an embodiment. Referring to FIG. 2A, the semiconductor system 200A may include a first semiconductor apparatus 210 and a second semiconductor apparatus 220. The first semiconductor apparatus 210 and the second semiconductor apparatus 220 may be coupled to each other through a data bus 203. The first semiconductor apparatus 210 may be coupled to the data bus 203 through a first transmission pad 211 and may transmit data DQ to the second semiconductor apparatus 220 through the first transmission pad 211 and the data bus 203. The second semiconductor apparatus 220 may include a first chip 221 and a second chip 222. The first chip 221 may be coupled to the data bus 203 through a first data pad 241 and may receive the data DQ through the data bus 203 and the first data pad 241. The second chip 222 may be coupled to the data bus 203 through a second data pad 242 and may receive the data DQ through the data bus 203 and the second data pad 242. In the first chip 221, a data circuit 231 configured to receive the data DQ may include a resistor R, a capacitor C and a switch S. The resistor R of the data circuit 231 may be an equivalent element corresponding to the termination resistance and the capacitor C of the data circuit 231 may be an equivalent element corresponding to actual circuits (such as a receiver, an amplifier and so forth) configured to receive the data DQ. In the second chip 222, a data circuit 232 configured to receive the data DQ may include a resistor R, a capacitor C and a switch S. The resistor R of the data circuit 232 may be an equivalent element corresponding to the termination resistance and the capacitor C of the data circuit 232 may be an equivalent element corresponding to actual circuits (such as a receiver, an amplifier and so forth) configured to receive the data DQ.

When the data circuit 231 of the first chip 221 receives the data DQ from the data bus 203, the second chip 222 may receive the first termination control signal ODT12 from the first chip 221. The switch S of the data circuit 232 may be turned on in response to the first termination control signal ODT12 and the resistor R of the data circuit 232 may be coupled to the data bus 203 through the second data pad 242. Therefore, the second chip 222 may provide the termination resistance to assist the first chip 221 to receive data DQ by setting the reception end of the data bus 203 to have the termination resistance value when the first chip 221 receives the data DQ. When the data circuit 232 of the second chip 222 receives the data DQ from the data bus 203, the first chip 221 may receive the second termination control signal ODT21 from the second chip 222. The switch S of the data circuit 231 may be turned on in response to the second termination control signal ODT21 and the resistor R of the data circuit 231 may be coupled to the data bus 203 through the first data pad 241. Therefore, the first chip 221 may provide the termination resistance to assist the second chip 222 to receive data DQ by setting the reception end of the data bus 203 to have the termination resistance value when the second chip 222 receives the data DQ.

In a case of the semiconductor system 200B of FIG. 2B, the data DQ transmitted through the data bus 203 may be distorted more severely when the data circuits 231 and 232 of the first chip 221 and the second chip 222 are disposed relatively further from the first data pad 241 and the second data pad 242 than for example the data circuits 231 and 232 of FIG. 2A. Because the data circuits 231 and 232 are disposed relatively farther from the first data pad 241 and the second data pad 242, respectively, the data circuits 231 and 232 may be respectively coupled to the first data pad 241 and the second data pad 242 through signal transmission lines such as redistribution layer RDL. The signal distortion may be alleviated and the data circuits 231 and 232 may receive the precise data DQ through the Non-Target On-Die Termination according to which the second chip 222 instead of the first chip 221 provides the termination resistance R when the first chip 221 receives the data DQ and the first chip 221 instead of the second chip 222 provides the termination resistance R when the second chip 222 receives the data DQ.

Figure 3:
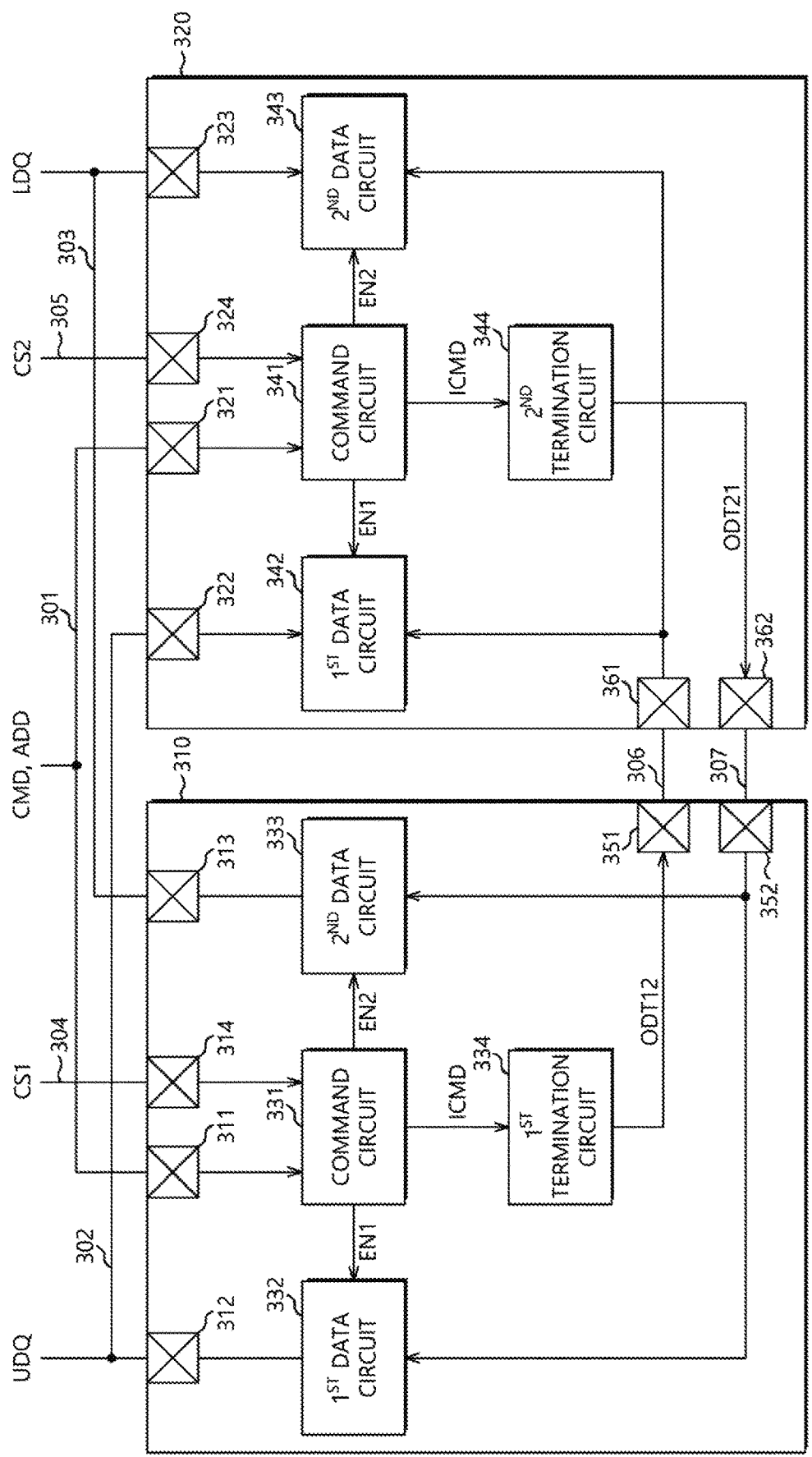
FIG. 3 is a diagram illustrating a configuration of first and second chips configuring a semiconductor apparatus in accordance with an embodiment.

FIG. 3 is a diagram illustrating a configuration of a semiconductor apparatus 300 in accordance with an embodiment. The semiconductor apparatus 300 may be applied as the second semiconductor apparatus 120 described with reference to FIG. 1. Referring to FIG. 3, the semiconductor apparatus 300 may include a first chip 310 and a second chip 320. The first chip 310 and the second chip 320 may be commonly coupled to a command address bus 301. The first chip 310 and the second chip 320 may receive a command signal CMD and/or an address signal ADD through the command address bus 301. The first chip 310 and the second chip 320 may be commonly coupled to data buses 302 and 303. Referring to FIG. 3, the data buses 302 and 303 may include a first data bus 302 and a second data bus 303. Each of the first chip 310 and the second chip 320 may be coupled to both of the first data bus 302 and the second data bus 303. The first chip 310 and the second chip 320 may receive first data UDQ through the first data bus 302 and may receive second data LDQ through the second data bus 303. The first chip 310 may be coupled to a first chip selection bus 304. The second chip 320 may be coupled to a second chip selection bus 305. The first chip 310 may receive a first chip selection signal CS1 through the first chip selection bus 304 and the second chip 320 may receive a second chip selection signal CS2 through the second chip selection bus 305.

The first chip 310 may include a command address pad 311 coupled to the command address bus 301 and configured to receive the command signal CMD and/or the address signal ADD. The first chip 310 may include a first data pad 312 coupled to the first data bus 302 and configured to receive the first data UDQ. The first chip 310 may include a second data pad 313 coupled to the second data bus 303 and configured to receive the second data LDQ. The first chip 310 may include a first chip selection pad 314 coupled to the first chip selection bus 304 and configured to receive the first chip selection signal CS1.

The first chip 310 may include a command circuit 331, a first data circuit 332, a second data circuit 333 and a termination control circuit 334 (i.e., first termination control circuit). The command circuit 331 may be coupled to the command address pad 311 and the first chip selection pad 314, may receive the command signal CMD through the command address bus 301 and the command address pad 311 and may receive the first chip selection signal CS1 through the first chip selection bus 304 and the first chip selection pad 314. The command circuit 331 may receive the command signal CMD when the first chip selection signal CS1 is enabled. The command circuit 331 may activate the first data circuit 332, the second data circuit 333 and the termination control circuit 334 based on the command signal CMD when the first chip selection signal CS1 is enabled. The command circuit 331 may generate an internal command signal ICMD by decoding the command signal CMD. The command circuit 331 may generate a first enable signal EN1 and a second enable signal EN2 based on the internal command signal ICMD. The first enable signal EN1 may be provided to the first data circuit 332. The second enable signal EN2 may be provided to the second data circuit 333. An operation that the semiconductor apparatus 300 receives the first data UDQ and the second data LDQ through the first data bus 302 and the second data bus 303 is defined as a write operation. For example, the internal command signal ICMD may be a write signal.

The first data circuit 332 may be coupled to the first data bus 302 through the first data pad 312. The first data circuit 332 may receive the first data UDQ transferred through the first data bus 302 when the first enable signal EN1 is enabled. When receiving the first data UDQ, the first data circuit 332 may provide the received first data UDQ to an internal circuit (not illustrated) of the first chip 310. The second data circuit 333 may be coupled to the second data bus 303 through the second data pad 313. The second data circuit 333 may receive the second data LDQ transferred through the second data bus 303 when the second enable signal EN2 is enabled. When receiving the second data LDQ, the second data circuit 333 may provide the received second data LDQ to the internal circuit of the first chip 310.

The termination control circuit 334 may receive the internal command signal ICMD from the command circuit 331. The termination control circuit 334 may generate a first termination control signal ODT12 based on the internal command signal ICMD. The termination control circuit 334 may provide the first termination control signal ODT12 to the second chip 320.

The second chip 320 may include a command address pad 321 coupled to the command address bus 301 and configured to receive the command signal CMD and/or the address signal ADD. The second chip 320 may include a first data pad 322 coupled to the first data bus 302 and configured to receive the first data UDQ. The second chip 320 may include a second data pad 323 coupled to the second data bus 303 and configured to receive the second data LDQ. The second chip 320 may include a second chip selection pad 324 coupled to the second chip selection bus 305 and configured to receive the second chip selection signal CS2.

The second chip 320 may include a command circuit 341, a first data circuit 342, a second data circuit 343 and a termination control circuit 344 (i.e., second termination control circuit). The command circuit 341 may be coupled to the command address pad 321 and the second chip selection pad 324, may receive the command signal CMD through the command address bus 301 and the command address pad 321 and may receive the second chip selection signal CS2 through the second chip selection bus 305 and the second chip selection pad 324. The command circuit 341 may receive the command signal CMD when the second chip selection signal CS2 is enabled. The command circuit 341 may activate the first data circuit 342, the second data circuit 343 and the termination control circuit 344 based on the command signal CMD when the second chip selection signal CS2 is enabled. The command circuit 341 may generate an internal command signal ICMD by decoding the command signal CMD. The command circuit 341 may generate a first enable signal EN1 and a second enable signal EN2 based on the internal command signal ICMD. The first enable signal EN1 may be provided to the first data circuit 342. The second enable signal EN2 may be provided to the second data circuit 343.

The first data circuit 342 may be coupled to the first data bus 302 through the first data pad 322. The first data circuit 342 may receive the first data UDQ transferred through the first data bus 302 when the first enable signal EN1 is enabled. When receiving the first data UDQ, the first data circuit 342 may provide the received first data UDQ to an internal circuit (not illustrated) of the second chip 320. The second data circuit 343 may be coupled to the second data bus 303 through the second data pad 323. The second data circuit 343 may receive the second data LDQ transferred through the second data bus 303 when the second enable signal EN2 is enabled. When receiving the second data LDQ, the second data circuit 343 may provide the received second data LDQ to the internal circuit of the second chip 320.

The termination control circuit 344 may receive the internal command signal ICMD from the command circuit 341. The termination control circuit 344 may generate a second termination control signal ODT21 based on the internal command signal ICMD. The termination control circuit 344 may provide the second termination control signal ODT21 to the first chip 310.

The semiconductor apparatus 300 may include a first signal transmission line 306 and a second signal transmission line 307. The first signal transmission line 306 and the second signal transmission line 307 may be coupled between the first chip 310 and the second chip 320. The first chip 310 may provide the first termination control signal ODT12 to the second chip 320 through the first signal transmission line 306. The second chip 320 may provide the second termination control signal ODT21 to the first chip 310 through the second signal transmission line 307. The termination control circuit 334 of the first chip 310 may generate the first termination control signal ODT12 and may provide the first termination control signal ODT12 to the second chip 320 through a first transmission pad 351 and the first signal transmission line 306. The second chip 320 may receive the first termination control signal ODT12 through a first reception pad 361 coupled to the first signal transmission line 306. The first termination control signal ODT12 may be provided to the first data circuit 342 and the second data circuit 343 of the second chip 320. The termination control circuit 344 of the second chip 320 may generate the second termination control signal ODT21 and may provide the second termination control signal ODT21 to the first chip 310 through a second transmission pad 362 and the second signal transmission line 307. The first chip 310 may receive the second termination control signal ODT21 through a second reception pad 352 coupled to the second signal transmission line 307. The second termination control signal ODT21 may be provided to the first data circuit 332 and the second data circuit 333 of the first chip 310. The semiconductor apparatus 300 may perform the Non-Target On-Die Termination operation by itself since the semiconductor apparatus 300 includes the first signal transmission line 306 and the second signal transmission line 307 configured to transfer the first termination control signal ODT12 and the second termination control signal ODT21 between the first chip 310 and the second chip 320. Therefore, there is no need to change a control scheme or design of the first semiconductor apparatus 110 described with reference to FIG. 1 in order to implement the Non-Target On-Die Termination.

The first chip 310 may provide the termination resistance used by the second chip 320 to receive data DQ based on the second termination control signal ODT21. The first chip 310 may set the resistance values of the reception ends of the first data bus 302 and the second data bus 303 to the termination resistance value based on the second termination control signal ODT21. The first data circuit 332 and the second data circuit 333 of the first chip 310 may be set to have the termination resistance value based on the second termination control signal ODT21. That is, the resistance value of the first data circuit 332 coupled to the first data bus 302 may be set to the termination resistance value and the resistance value of the second data circuit 333 coupled to the second data bus 303 may be set to the termination resistance value. The second chip 320 may provide the termination resistance used by the first chip 310 to receive data DQ based on the first termination control signal ODT12. The second chip 320 may set the resistance values of the reception ends of the first data bus 302 and the second data bus 303 to the termination resistance value based on the first termination control signal ODT12. The first data circuit 342 and the second data circuit 343 of the second chip 320 may be set to have the termination resistance value based on the first termination control signal ODT12. That is, the resistance value of the first data circuit 342 coupled to the first data bus 302 may be set to the termination resistance value and the resistance value of the second data circuit 343 coupled to the second data bus 303 may be set to the termination resistance value.

Hereinafter, the operation of the semiconductor apparatus 300 and the semiconductor system 100 will be described. The first semiconductor apparatus 110 may transmit the command signal CMD through the command address bus 301 and the first chip selection signal CS1 through the first chip selection bus 304 in order for the first chip 310 to perform a write operation. When the first chip selection signal CS1 is enabled, the command circuit 331 of the first chip 310 may receive the command signal CMD, may generate the internal command signal ICMD by decoding the command signal CMD and may enable the first enable signal EN1 and the second enable signal EN2. The termination control circuit 334 may generate the first termination control signal ODT12 based on the internal command signal ICMD. The termination control circuit 334 may transmit the first termination control signal ODT12 to the second chip 320 through the first signal transmission line 306. The first termination control signal ODT12 may be provided to the first data circuit 342 and the second data circuit 343 of the second chip 320. The first data circuit 342 of the second chip 320 may set the reception end of the first data bus 302 to have the termination resistance value based on the first termination control signal ODT12 and the second data circuit 343 of the second chip 320 may set the reception end of the second data bus 303 to have the termination resistance value based on the first termination control signal ODT12. After that, the first semiconductor apparatus 110 may transmit the first data UDQ and the second data LDQ through the first data bus 302 and the second data bus 303, respectively. The first data circuit 332 of the first chip 310 may be activated on the basis of the first enable signal EN1 and may receive the first data UDQ transferred through the first data bus 302. The second data circuit 333 of the first chip 310 may be activated on the basis of the second enable signal EN2 and may receive the second data LDQ transferred through the second data bus 303. As described above, the first data circuit 342 and the second data circuit 343 of the second chip 320 may provide the termination resistance when the first data circuit 332 and the second data circuit 333 of the first chip 310 respectively receive the first data UDQ and the second data LDQ.

The first semiconductor apparatus 110 may transmit the command signal CMD through the command address bus 301 and the second chip selection signal CS2 through the second chip selection bus 305 in order for the second chip 320 to perform a write operation. When the second chip selection signal CS2 is enabled, the command circuit 341 of the second chip 320 may receive the command signal CMD, may generate the internal command signal ICMD by decoding the command signal CMD and may enable the first enable signal EN1 and the second enable signal EN2. The termination control circuit 344 may generate the second termination control signal ODT21 based on the internal command signal ICMD. The termination control circuit 344 may transmit the second termination control signal ODT21 to the first chip 310 through the second signal transmission line 307. The second termination control signal ODT21 may be provided to the first data circuit 332 and the second data circuit 333 of the first chip 310. The first data circuit 332 of the first chip 310 may set the reception end of the first data bus 302 to have the termination resistance value based on the second termination control signal ODT21 and the second data circuit 333 of the first chip 310 may set the reception end of the second data bus 303 to have the termination resistance value based on the second termination control signal ODT21. After that, the first semiconductor apparatus 110 may transmit the first data UDQ and the second data LDQ through the first data bus 302 and the second data bus 303, respectively. The first data circuit 342 of the second chip 320 may be activated on the basis of the first enable signal EN1 and may receive the first data UDQ transferred through the first data bus 302. The second data circuit 343 of the second chip 320 may be activated on the basis of the second enable signal EN2 and may receive the second data LDQ transferred through the second data bus 303. As described above, the first data circuit 332 and the second data circuit 333 of the first chip 310 may provide the termination resistance when the first data circuit 342 and the second data circuit 343 of the second chip 320 respectively receive the first data UDQ and the second data LDQ.

While some embodiments have been described above, it will be understood by those skilled in the art that additional embodiments are possible. Accordingly, the signal receiving circuit described herein should not be limited based on the described embodiments.

What is claimed is:
1. A semiconductor apparatus comprising:
   a first chip configured to generate a first termination control signal based on a command signal when a first chip selection signal is enabled, the first chip comprising:
      a data circuit coupled to a data bus, and configured to receive data transmitted through the data bus based on an enable signal;
      a first termination control circuit configured to generate the first termination control signal based on an internal command signal; and
      a command circuit coupled to a command bus and a first chip selection bus and configured to generate the internal command signal and the enable signal based on the command signal transmitted through the command bus when the first chip selection signal transmitted through the first chip selection bus is enabled; and
   a second chip coupled to the first chip,
   wherein the first chip transmits the first termination control signal to the second chip and the second chip provides a termination resistance based on the first termination control signal.
2. The semiconductor apparatus of claim 1,
   wherein the second chip configured to generate a second termination control signal based on the command signal when a second chip selection signal is enabled, and wherein the second chip transmits the second termination control signal to the first chip and the first chip provides a termination resistance based on the second termination control signal.

3. The semiconductor apparatus of claim 2, further comprising:
a first signal transmission line configured to transfer the first termination control signal from the first chip to the second chip; and
a second signal transmission line configured to transfer the second termination control signal from the second chip to the first chip.

4. The semiconductor apparatus of claim 1, wherein the data circuit sets a reception end of the data bus to have a termination resistance value based on the second termination control signal.

5. The semiconductor apparatus of claim 1,
wherein the first chip includes a data circuit coupled to a data bus, and configured to receive data transmitted through the data bus based on an enable signal, and
wherein the second chip sets a reception end of the data bus to have a termination resistance value based on the first termination control signal.

6. The semiconductor apparatus of claim 1, wherein the second chip includes:
a data circuit coupled to a data bus, and configured to receive data transmitted through the data bus based on an enable signal;
a second termination control circuit configured to generate the second termination control signal based on an internal command signal; and
a command circuit coupled to a command bus and a second chip selection bus and configured to generate the internal command signal and the enable signal based on the command signal transmitted through the command bus when the second chip selection signal transmitted through the second chip selection bus is enabled.

7. The semiconductor apparatus of claim 6, wherein the data circuit sets a reception end of the data bus to have a termination resistance value based on the first termination control signal.

8. A semiconductor apparatus comprising:
a first chip coupled to a second chip,
wherein the first chip includes:
a data circuit coupled to a data bus, and configured to receive data transmitted through the data bus;
a command circuit coupled to a command bus and a first chip selection bus, and configured to receive a command signal through the command bus and receive a first chip selection signal through the first chip selection bus; and
a first termination control circuit configured to generate a first termination control signal based on the command signal,
wherein the second chip includes:
a data circuit coupled to the data bus, and configured to receive data transmitted through the data bus and receive the first termination control signal from the first chip;
a command circuit coupled to the command bus and a second chip selection bus and configured to receive the command signal through the command bus and receive a second chip selection signal through the second chip selection bus; and
a second termination control circuit configured to generate a second termination control signal based on the command signal.

9. The semiconductor apparatus of claim 8, wherein the second chip provides a termination resistance to the data bus based on the first termination control signal when the data circuit of the first chip receives the data through the data bus.

10. The semiconductor apparatus of claim 9, wherein the data circuit of the first chip receives the second termination control signal from the second chip.

11. The semiconductor apparatus of claim 8, wherein the data circuit of the first chip provides a termination resistance to the data bus based on the second termination control signal when the data circuit of the second chip receives the data through the data bus.

12. The semiconductor apparatus of claim 8,
further comprising a first signal transmission line and a second signal transmission line coupled between the first chip and the second chip,
wherein the first chip transmits the first termination control signal to the second chip through the first signal transmission line, and
wherein the second chip transmits the second termination control signal to the first chip through the second signal transmission line.

13. A semiconductor system comprising:
a data bus;
a command bus;
a first chip selection bus;
a second chip selection bus;
a first semiconductor apparatus configured to transmit data through the data bus, transmit a command signal through the command bus, transmit a first chip selection signal through the first chip selection bus and transmit a second chip selection signal through the second chip selection bus; and
a second semiconductor apparatus including a first chip coupled to the data bus, the command bus and the first chip selection bus and configured to receive the data, the command signal and the first chip selection signal; and a second chip coupled to the data bus, the command bus and the second chip selection bus and configured to receive the data, the command signal and the second chip selection signal,
wherein the second chip sets a reception end of the data bus to have a termination resistance value when the first chip selection signal is enabled and the first chip receives the data, and
wherein the first chip sets the reception end of the data bus to have the termination resistance value when the second chip selection signal is enabled and the second chip receives the data.

14. The semiconductor system of claim 13, wherein the first chip includes:
a data circuit configured to receive the data through the data bus; and
a first termination control circuit configured to generate the first termination control signal based on the first chip selection signal and the command signal and transmit the first termination control signal to the second chip.

15. The semiconductor system of claim 14, wherein the second chip includes:
a data circuit configured to receive the data through the data bus; and
a second termination control circuit configured to generate the second termination control signal based on the second chip selection signal and the command signal and transmit the second termination control signal to the first chip.

16. The semiconductor system of claim 13, wherein the data circuit of the first chip sets a reception end of the data bus to have a termination resistance value based on the second termination control signal.

17. The semiconductor system of claim 13, wherein the data circuit of the second chip sets a reception end of the data bus to have a termination resistance value based on the first termination control signal.

18. The semiconductor system of claim 13, further comprising:
- a first signal transmission line coupled between the first chip and the second chip and configured to transfer the first termination control signal from the first chip to the second chip; and
- a second signal transmission line coupled between the first chip and the second chip and configured to transfer the second termination control signal from the second chip to the first chip.

* * * * *